(12) United States Patent
Yamazaki et al.

(10) Patent No.: US 7,102,231 B2
(45) Date of Patent: Sep. 5, 2006

(54) DISPLAY DEVICE AND MANUFACTURING METHOD THEREOF

(75) Inventors: Shunpei Yamazaki, Setagaya (JP); Mitsuaki Osame, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/664,962

(22) Filed: Sep. 22, 2003

(65) Prior Publication Data

US 2004/0056855 A1 Mar. 25, 2004

(30) Foreign Application Priority Data

Sep. 20, 2002 (JP) .............................. 2002-276295

(51) Int. Cl.
  *H01L 23/48* (2006.01)
(52) U.S. Cl. .................. 257/751; 257/762; 257/784
(58) Field of Classification Search ................ 257/347, 257/350, 368, 351, 762, 751, 784
  See application file for complete search history.

(56) References Cited

U.S. PATENT DOCUMENTS

| | | | |
|---|---|---|---|
| 4,033,833 A | 7/1977 | Bestel et al. | |
| 4,659,650 A | 4/1987 | Moritz et al. | |
| 5,100,499 A | 3/1992 | Douglas | |
| 5,693,563 A | 12/1997 | Teong | |
| 5,726,461 A | 3/1998 | Shimada et al. | |
| 5,851,918 A | 12/1998 | Song et al. | |
| 5,889,291 A | 3/1999 | Koyama et al. | |
| 5,929,948 A | 7/1999 | Ohori et al. | |
| 6,015,724 A | 1/2000 | Yamazaki | |
| 6,031,290 A | 2/2000 | Miyazaki et al. | |
| 6,265,247 B1 | 7/2001 | Nakanishi et al. | |
| 6,359,320 B1 | 3/2002 | Yamazaki et al. | |
| 6,413,845 B1 | 7/2002 | Izumi et al. | |
| 6,475,912 B1 | 11/2002 | Harada | |
| 6,479,900 B1 | 11/2002 | Shinogi et al. | |
| 6,498,091 B1 * | 12/2002 | Chen et al. ................. | 438/627 |
| 6,509,616 B1 | 1/2003 | Yamazaki | |
| 6,509,649 B1 | 1/2003 | Sugai | |

(Continued)

FOREIGN PATENT DOCUMENTS

EP 0 989 614 3/2000

(Continued)

OTHER PUBLICATIONS

Tetsuo Tsutsui et al., *High Quantum Efficiency in Organic Light-Emitting Devices with Iridium-Complex as a Triplet Emissive Center*, Jp. J. Appl. Phys., vol. 38 (1999), pp. L1502, L1504, Part 2, No. 12B, Dec. 15, 1999.

(Continued)

*Primary Examiner*—Tuan H. Nguyen
(74) *Attorney, Agent, or Firm*—Eric J. Robinson; Robinson Intellectual Property Law Office, P.C.

(57) ABSTRACT

It is an object of the present invention to prevent an influence of voltage drop due to wiring resistance, trouble in writing of a signal into a pixel, and trouble in gray scales, and provide a display device with higher definition, represented by an EL display device and a liquid crystal display device. In the present invention, a wiring including Cu is provided as an electrode or a wiring used for the display device represented by the EL display device and the liquid crystal display device. Besides, sputtering is performed with a mask to form the wiring including Cu. With such structure, it is possible to reduce the voltage drop and a deadened signal.

59 Claims, 12 Drawing Sheets

U.S. PATENT DOCUMENTS

| | | |
|---|---|---|
| 6,515,365 B1 | 2/2003 | Higashi et al. |
| 6,573,602 B1 | 6/2003 | Seo et al. |
| 6,890,849 B1 * | 5/2005 | Kado et al. ............. 438/625 |
| 6,905,907 B1 * | 6/2005 | Konuma ................. 438/99 |
| 2001/0010370 A1 | 8/2001 | Kimura et al. |
| 2001/0015618 A1 | 8/2001 | Yamazaki et al. |
| 2001/0030322 A1 | 10/2001 | Asada et al. |
| 2002/0009818 A1 * | 1/2002 | Yoshimoto ............... 438/30 |
| 2002/0044124 A1 | 4/2002 | Yamazaki et al. |
| 2002/0063287 A1 | 5/2002 | Yamazaki et al. |
| 2002/0070382 A1 | 6/2002 | Yamazaki et al. |
| 2002/0079503 A1 | 6/2002 | Yamazaki et al. |
| 2003/0090002 A1 | 5/2003 | Sugwara et al. |
| 2003/0127649 A1 * | 7/2003 | Chae ...................... 257/72 |
| 2004/0058527 A1 * | 3/2004 | Yamazaki et al. ........ 438/643 |
| 2005/0014359 A1 * | 1/2005 | Segawa et al. ........... 438/622 |
| 2005/0020061 A1 * | 1/2005 | Fang et al. .............. 438/653 |

FOREIGN PATENT DOCUMENTS

| | | |
|---|---|---|
| EP | 1 063 693 | 12/2000 |
| JP | 57-126967 | 8/1982 |
| JP | 61-235560 | 10/1986 |
| JP | 05-066421 | 3/1993 |
| JP | 06-148685 | 5/1994 |
| JP | 07-235680 | 9/1995 |
| JP | 08-274336 | 10/1996 |
| JP | 10-090711 | 4/1998 |
| JP | 11-016912 | 1/1999 |
| JP | 2000-058650 | 2/2000 |
| JP | 2000-357671 | 12/2000 |
| JP | 2001-196371 | 7/2001 |
| JP | 2001-236025 | 8/2001 |
| JP | 2001-254169 | 9/2001 |
| JP | 2001-313397 | 11/2001 |
| JP | 2002-108243 | 4/2002 |
| JP | 2002-353167 | 12/2002 |
| WO | WO 00/36641 | 6/2000 |

OTHER PUBLICATIONS

M.A. Baldo et al., *Very High-Efficiency Green Organic Light-Emitting Devices Based on Electrophosphorescence*, Applied Physics Letters, vol. 75, No. 1, Jul. 5, 1999, pp. 4-6.

M.A. Baldo et al., *High Efficient Phosphorescent Emission from Organic Electroluminescent Devices*, Letter to Nature vol. 395, Sep. 10, 1998, pp. 151-154.

Stanely Wolf, 4.5.6.3 *Contact-Hole and Via Filling with Selective Electroless Metal Deposition*, Silicon Processing for the VLSI Era, vol. 2, Process Integration, pp. 256-257.

Mutsuko Hatano et al., *A Novel Self-Aligned Gate-Overlapped LDD Poly-Si TFT with High Reliability and Performance*, IEDM, 1997, pp. 523-526.

International Search Report dated Dec. 24, 2003.

Written Opinion, Application No. PCT/JP03/11977 filed Sep. 19, 2003, PCT Office, May 25, 2004.

* cited by examiner

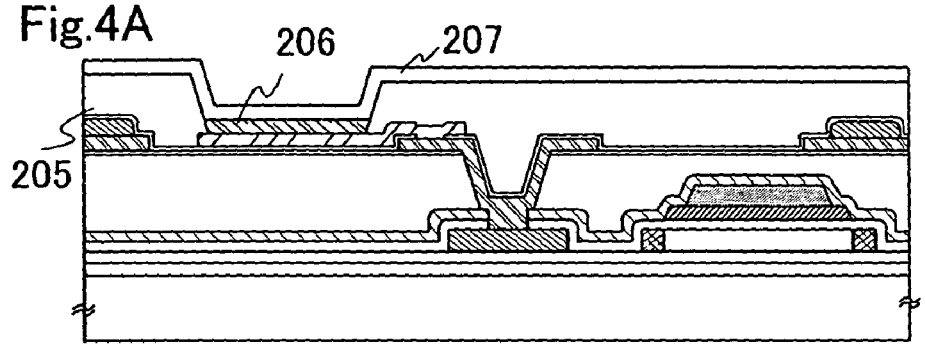
Fig.4A
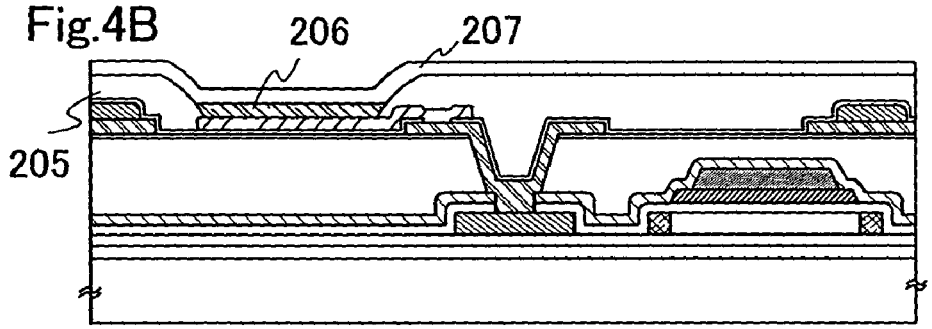
Fig.4B
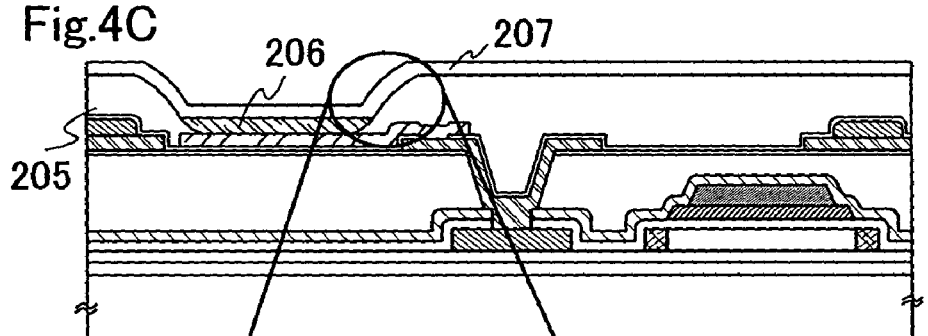
Fig.4C
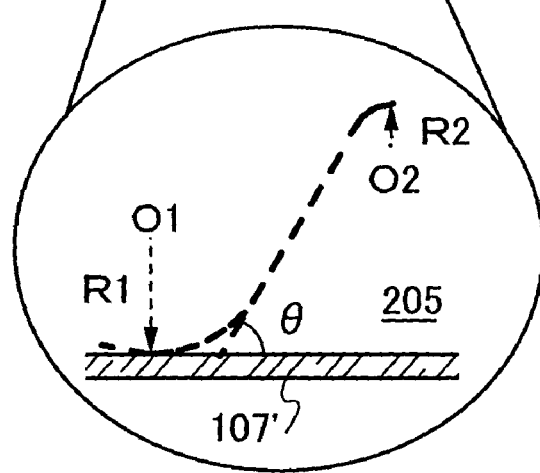

Fig.6A
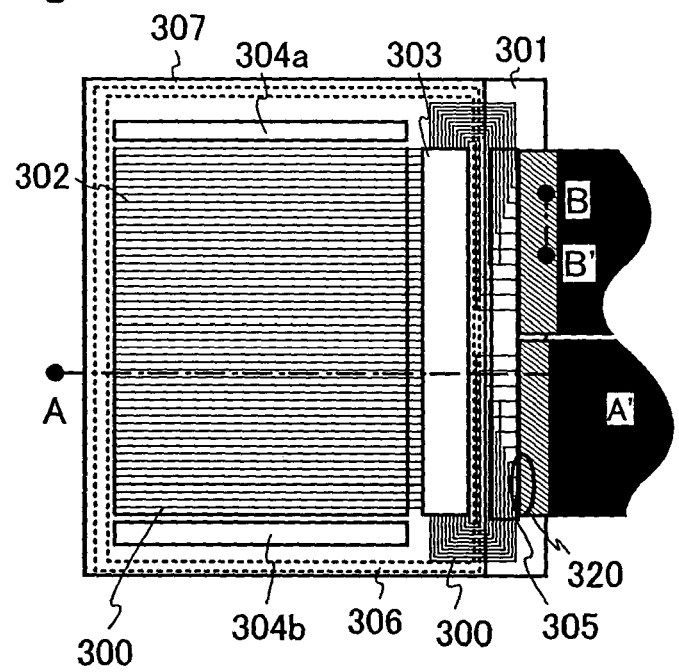
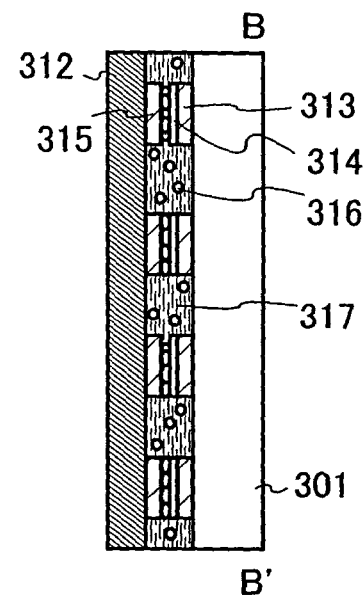
Fig.6B
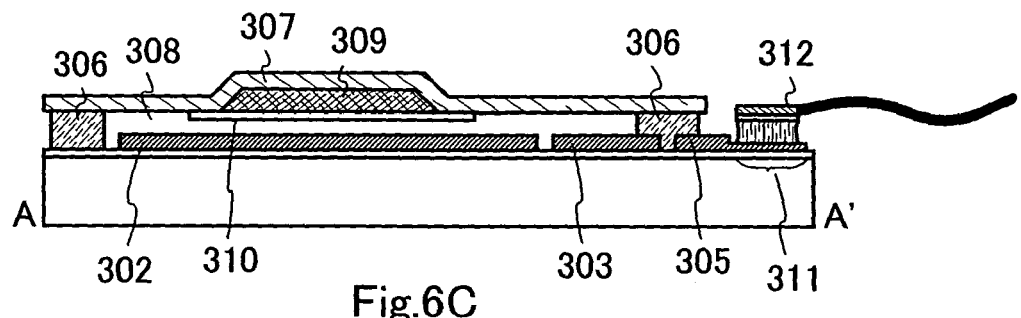
Fig.6C

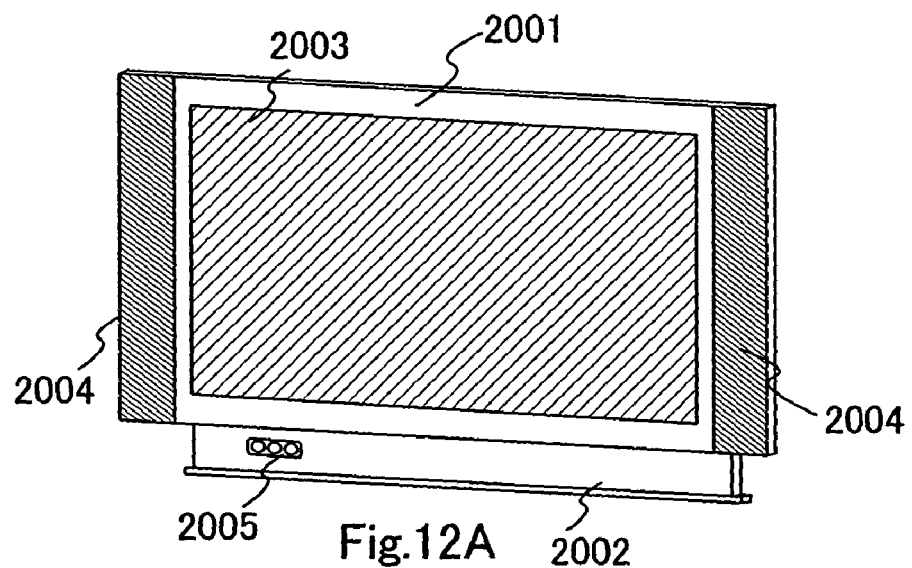
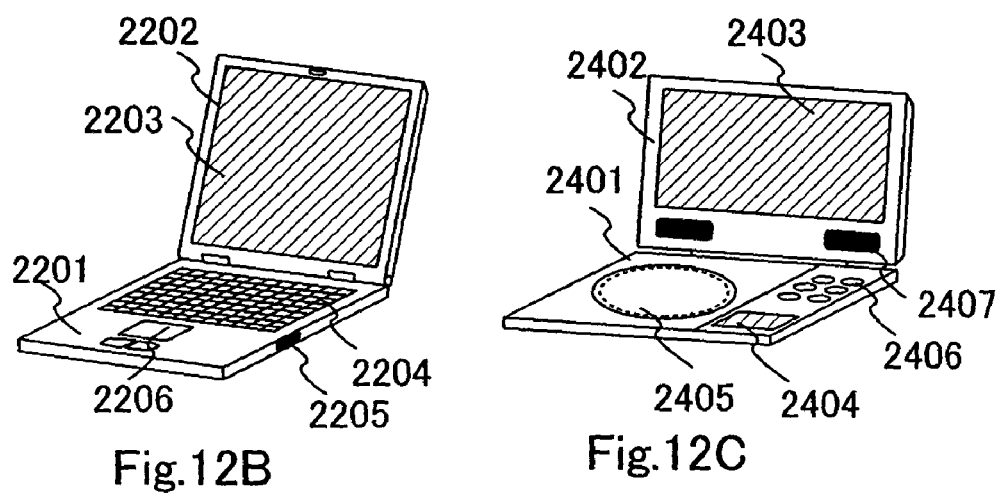

DISPLAY DEVICE AND MANUFACTURING METHOD THEREOF

BACKGROUND OF THE INVENTION

1. Field of the Invention

The present invention relates to a semiconductor device that has a semiconductor element (specifically, a thin film transistor), and also relates to display devices such as an EL display device (a light emitting device) provided with a light emitting element and a liquid crystal display device and a manufacturing method there of, especially, to a large-sized display device and a manufacturing method thereof.

2. Description of the Related Art

These days, it has been proceeded to make a screen have a large size and a high definition in active matrix semiconductor devices such as an EL display device and a liquid crystal display device, and the number of wirings such as signal lines and scan lines tends to increase as well as a length of the wiring. Therefore, it is required to prevent voltage drop due to wiring resistance, trouble in writing of a signal into a pixel, and trouble in gray scales.

In the EL display device, a driving method for displaying an image with multiple gray scales has a voltage input system of inputting voltage from a signal line and a current input system of inputting current from a signal line, and further, the voltage input system has a current writing system of writing data in current format (driving current) into a light emitting element for controlling luminance and a voltage writing system of writing data in voltage format into a light emitting element for controlling luminance while the current input system has the current writing system. Such driving method especially has trouble caused due to wiring resistance. The wiring resistance causes delay in transmission of a signal to a terminal of a signal line, and the voltage drop of a power source line (specifically, a current supply line) makes it difficult to supply predetermined current or voltage. Then, fluctuation in displaying is caused as the result since luminance of light emitted from the light emitting element is proportional to a value of the current or voltage supplied through the signal line. Further, due to the voltage drop, the EL display device and the liquid crystal display device have trouble of waveform distortion of a pulse signal input through the wiring.

In the case of using copper as a material with low resistance for forming a wiring, there is a means of forming a plugged wiring (a structure formed with damascene). In the damascene, however, an insulating film is provided at the position of a wiring to be formed, a groove for forming the wiring is formed in the insulating film, and then a Cu wiring is formed in the groove (for example, Japanese Patent Laid-Open 2000-58650).

Therefore, in conventional display devices, beaten-copper with low resistance is used for a PWB-side wiring of a printed-wiring board (PWB) in electrically connecting the PWB-side wiring to an element-side wiring with an isotropic conductive film instead of a wiring to suppress voltage drop of the element-side wiring and signal delay (for example, Japanese Patent Laid-Open 2001-236025).

SUMMARY OF THE INVENTION

It is an object of the present invention to prevent the above-mentioned influence of the voltage drop due to the wiring resistance, the trouble in writing of driving current into a pixel, and the trouble in gray scales and to provide semiconductor devices with higher definition, represented by an EL display device and a liquid crystal display device. In addition, it is also an object of the present invention to form a wiring with wiring resistance reduced in accordance with fewer processes and provide a semiconductor device that has the wiring with low resistance.

In order to achieve the above objects, a wiring including Cu is formed in the present invention as a wiring or an electrode used for display devices represented by an EL display device and a liquid crystal display device. It is noted that the wiring including Cu includes a wiring in which a wiring containing Cu as its main component (Hereinafter, a Cu wiring) is laminated on a wiring or an electrode with a single-layer structure. Also, it is noted that the wiring including Cu includes a wiring in which a Cu wiring is laminated on a wiring or an electrode with a laminate structure, and includes a structure in which one of layers of a wiring or an electrode with the laminate structure is a Cu wiring. Specifically, a signal line, a scan line, a current supply line, a power source line, a source electrode, a drain electrode, and a gate electrode are included in the wiring or the electrode.

A conductive film named functionally is the wiring or the electrode, for example, assuming a gate electrode, a source electrode, and a drain electrode of a thin film transistor (Hereinafter TFT), a signal line, a scan line, a current supply line, or the like. Since the wiring and the electrode can be obtained when a conductive film is subjected to patterning into a predetermined shape, the wiring and the electrode also collectively mean a conductive film. It is noted that the electrode is not clearly distinguished from the wiring since a portion of the signal line, the scan line, or the current supply line is an electrode.

Such a wiring material Cu diffuses into a semiconductor film and an interlayer insulating film and has a harmful influence on electric characteristics of a TFT. In the present invention, therefore, a barrier film (a barrier layer) is provided at least between an active layer and the Cu wiring in order to prevent penetration of Cu into the active layer (a semiconductor film subjected to patterning into an island-shape) of a TFT.

Such barrier film is formed of a conductive film containing nitrogen or carbon (a conductive barrier film), and one kind or plural kinds of materials selected from tantalum nitride (TaN), titanium nitride (TiN), tungsten nitride (WN), tantalum carbide (TaC), and titanium carbide (TiC) may be used. In addition, a ternary-system amorphous barrier film containing Si may be used for the conductive barrier film. The conductive barrier film may be one of layers of the wiring or the electrode.

More preferably, a barrier film formed of an insulating film (an insulating barrier film) containing nitrogen is formed for covering the Cu wiring. One kind or plural kinds of materials selected from silicon nitride (SiN), silicon oxynitride (SiNO), and aluminum nitride (AlN or $Al_xN_y$), for example, may be used to form the insulating barrier film containing nitrogen.

Further, the Cu wiring of the present invention is formed with sputtering. It is preferable to form at least the conductive barrier film, the Cu wiring, and the insulating barrier film sequentially film with sputtering.

FIGS. 11A to 11D show examples of specific structures of the wiring or the electrode of the present invention, and an explanation will be given with FIGS. 11A to 11D on a structure in which a Cu wiring formed on a conductive barrier film is covered with an insulating barrier film.

A wiring shown in FIG. 11A has a structure in which a conductive film containing Ti, a conductive barrier film containing TiN, and Cu wiring are laminated in order from a substrate side, and an insulating barrier film containing SiN is provided for covering the Cu wiring. Hereinafter, the laminate structure is denoted as Ti/FiN/Cu/SiN from the substrate side. In the case of FIG. 11A, patterning is performed to the conductive film containing Ti and the conductive barrier film containing TiN at the same time, the Cu wiring is formed, and the insulating barrier film containing SiN is formed. Accordingly, a width of the conductive film containing Ti is the same as that of the conductive barrier film containing TiN, and a width of the Cu wiring is shorter than that of the conductive film containing Ti and the conductive barrier film containing TiN. It is noted that the width means a length in a channel length direction.

A wiring shown in FIG. 11B has a structure in which a conductive barrier film containing TiN and an insulating barrier film containing SiN are provided and conductive films of the wiring are laminated. The laminate structure is denoted as Ti/Al/TiN/Cu/SiN from the substrate side. In the case of FIG. 11B, patterning is performed to the conductive film containing Ti, the conductive film containing Al, and the conductive barrier film containing TiN at the same time, the Cu wiring is formed, and the insulating barrier film containing SiN is formed. Accordingly, the conductive film containing Ti, the conductive film containing Al, and the conductive barrier film containing TiN have the same width, and a width of the Cu wiring is shorter than that of the conductive film containing Ti, the conductive film containing Al, and the conductive barrier film containing TiN.

A wiring shown in FIG. 11C has a structure in which a conductive barrier film containing TaN and an insulating barrier film containing SiN are provided, and the laminate structure is denoted as Ti/TaN/Cu/SiN from the substrate side. In the case of FIG. 11C, patterning is performed to the conductive film containing Ti and the conductive barrier film containing TaN at the same time, the Cu wiring is formed, and the insulating barrier film containing SiN is formed. Accordingly, a width of the conductive film containing Ti is the same as that of the conductive barrier film containing TaN, and a width of the Cu wiring is shorter than that of the conductive film containing Ti and the conductive barrier film containing TaN.

A wiring shown in FIG. 11D has a structure in which a conductive barrier film containing WN and an insulating barrier film containing SiNO are provided, and the laminate structure is denoted as Ti/WN/Cu/SiNO from the substrate side. In the case of FIG. 11D, patterning is performed to the conductive film containing Ti and the conductive barrier film containing WN at the same time, the Cu wiring is formed, and the insulating barrier film containing SiNO is formed. Accordingly, a width of the conductive film containing Ti is the same as that of the conductive barrier film containing WN, and a width of the Cu wiring is shorter than that of the conductive film containing Ti and the conductive barrier film containing WN.

In short, the wiring of the present invention is formed in order that the conductive film and the conductive burrier film have the same width and the width of the Cu wiring is shorter than that of the conductive film and the conductive barrier film. The width of the conductive film and the conductive barrier film is on the order of 30 to 40 µm in a pixel portion, and it is preferable that the Cu wiring has a width on the order of 5 to 20 µm and a height on the order of 0.1 to 1 µm.

The wiring including Cu may be used as a source electrode and a drain electrode of a TFT. In this case, a similar structure to the structures of the wirings shown in FIGS. 11A to 11D may be used. Particularly, it is preferred that the wiring including Cu is used for a source electrode and a drain electrode of a TFT for supplying large current (for example, a buffer TFT of a driving circuit portion).

The wiring including Cu may also be used as a gate electrode. In this case, the Cu wiring may be formed on the conductive barrier film to become a part of the gate electrode. It is noted that a scan line formed at the same time as the gate electrode may also be of the wiring including Cu and the Cu wiring may be formed on the conductive barrier film.

Namely, the wiring including Cu of the present invention is applicable to any of wirings and electrodes such as a signal line, a scan line, a current supply line, a source electrode, a drain electrode, and a gate electrode. Since Cu has low resistance and makes it possible to flow large current, it is possible to reduce voltage drop and a deadened signal waveform when the wiring including Cu is used for the wirings and electrodes. In addition, a display device that has a Cu wiring with low resistance can have an area of a wiring and an electrode reduced, and it is possible to achieve a narrowed frame. Further, it is necessary to flow large current into a wiring in a middle-sized and a large sized (5 inch or more) EL display devices and liquid crystal display devices, and therefore the present invention is useful.

BRIEF DESCRIPTION OF THE DRAWINGS

In the accompanying drawings:

FIGS. 4A to 4C are diagrams that show sectional views of the pixel of the display device according to the present invention;

FIGS. 6A to 6C are diagrams that show a display device according to the present invention and a sectional view thereof;

FIGS. 12A to 12C are diagrams that show electronic devices that use a display device according to the present invention.

DETAILED DESCRIPTION OF THE PREFERRED EMBODIMENTS

Embodiment modes of the present invention will be described below with drawings. In the description below, a transistor has three terminals of a gate electrode, a source electrode, and a drain electrode. However, it is difficult to clearly distinguish between the source electrode and the drain electrode considering a structure of the transistor. In describing a connection between elements, therefore, one of the source electrode and the drain electrode is denoted as a first electrode, and the other is denoted as a second electrode.

Embodiment Mode 1

In the present embodiment mode, the case of applying a wiring including Cu to a signal line and a current supply line will be described with reference to FIGS. 1A to 4C.

Figure 1A:
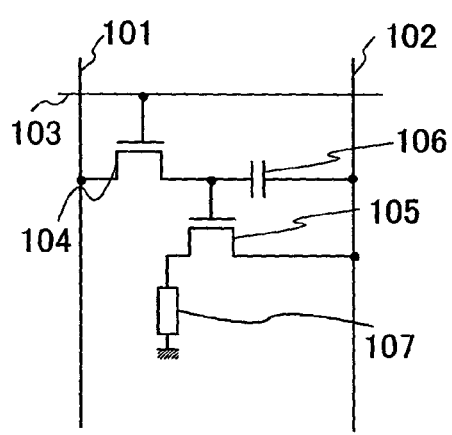
FIGS. 1A and 1B are diagrams that show a pixel of a display device according to the present invention.

FIG. 1A shows an equivalent circuit of a pixel of an EL display device. As shown in FIG. 1A, the pixel has at least a signal line 101, a current supply line 102, a scan line 103, plural TFTs 104 and 105, a capacitor 106, and a light emitting element 107. The TFTs 104 and 105 may have a multi-gate structure such as a double-gate structure or a triple-gate structure instead of a single-gate structure. It is unnecessary to provide the capacitor 106 in the case of having large gate capacities of the TFTs 104 and 105 and leakage current within the allowable range.

Here, it is the signal line 101, the current supply line 102, and the scan line 103 that have trouble due to wiring resistance. It is necessary to consider voltage drop due to the wiring resistance in the signal line 101 and the current supply line 102 particularly as a display device has a larger size. In the present embodiment mode, a wiring including Cu is used as at least the signal line 101 and the current supply line 102.

Figure 1B:
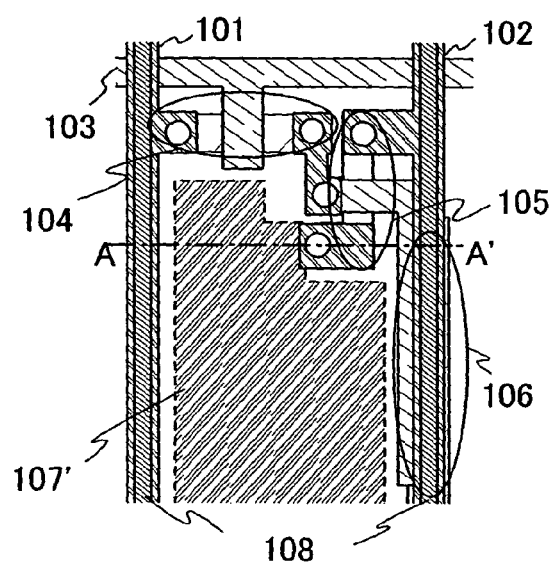

FIG. 1B shows a top view of FIG. 1A with a pixel electrode (a first electrode of the light emitting element) 107' formed, a Cu wiring 108 is laminated on the signal line 101 and the current supply line 102. The TFT 104 has a first electrode connected to the signal line 101 and a second electrode connected to the capacitor 106 and a gate electrode of the TFT 105, and a portion of the scan line 103 is a gate electrode of the TFT 104. The TFT 105 has a first electrode connected to the pixel electrode 107' and a second electrode connected to the current supply line 102. The capacitor 106 is formed in a region in which the current supply line 102 and a semiconductor film are laminated.

Figure 2A:
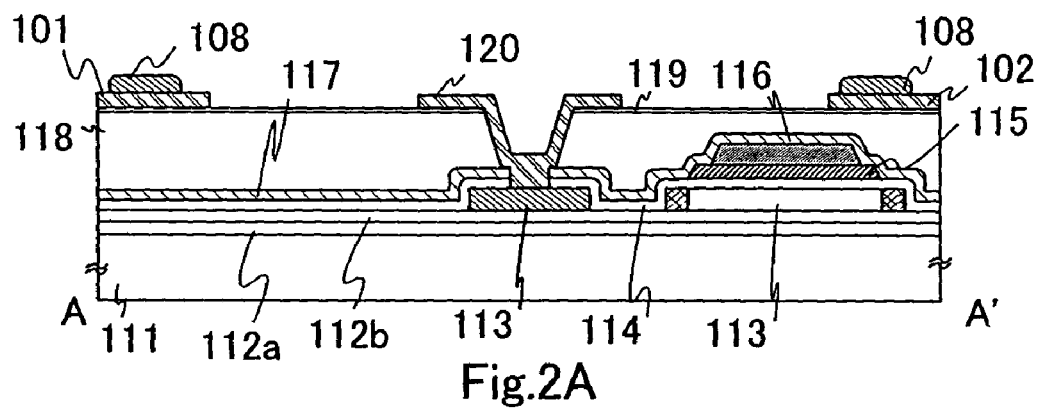
FIGS. 2A to 2C are diagrams that show sectional views of a pixel of a display device according to the present invention.

Next, an explanation will be given with FIG. 2A on a structure of a sectional view along A–A' shown in FIG. 1B. FIG. 2A shows a substrate 111 with an insulating surface, and it is possible to use any of a glass substrate, a ceramic substrate, a quartz substrate, a silicon substrate, and a plastic substrate (including a plastic film) as the substrate 111. On the substrate 111, a silicon oxynitride film 112a and a silicon oxynitride film 112b are laminated as a base film. Of course, it is not necessary to limit a material of the base film to silicon oxynitride. Further, a semiconductor film 113 for an active layer of the TFT 105 and for the capacitor 106 is provided on the silicon oxynitride film 112b.

The semiconductor film 103 of the TFT 105 is covered with a gate insulating film 114, and a gate electrode of a laminate of tantalum nitride (TaN) 115 and tungsten (W) 116 is provided thereon. Although a silicon oxynitride film is used as the gate insulating film 114 in the present embodiment mode, it is useful in terms of improving an integration level to use a nitrided insulating film with a high relative dielectric constant such as an aluminum nitride film since an element space required can be reduced. Although the metal films of the gate electrode have large selection ratios each other, such structure becomes possible when etching conditions are optimized. With respect to the etching conditions, it may be possible to refer to Japanese Patent Laid-Open 2001-313397 by the present applicant. The gate electrode or resist is used as a mask to form a source region, a drain region, and a channel forming region in the semiconductor film 113. In addition, an LDD region and a GOLD region overlapped with the gate electrode may appropriately be formed. It is noted that the source region, the drain region, the LDD region, or the GOLD region, into which an impurity is doped, is denoted as an impurity region. Further, a heating furnace or laser is used to activate the impurity region.

Besides, a silicon nitride film or silicon oxynitride film is provided as an insulating film 117 covering the gate electrode. In the present embodiment mode, a silicon oxynitride film is formed with plasma CVD. In addition, for planarization, a photosensitive or non-photosensitive organic material (polyimide, acrylic, polyamide, polyimideamide, resist, or benzocyclobutene), an inorganic material (such as silicon oxide, silicon nitride, or silicon oxynitride) formed with sputtering, CVD, or coating, or a laminate thereof is used to form a first insulating film 118 as an interlayer insulating film on the insulating film 117.

On the first insulating film 118, a first passivation film 119 including a nitrided insulating film (typically, a silicon nitride film or a silicon oxynitride film) is formed. In the present embodiment mode, a silicon nitride film is used for the first passivation film 119. After that, a contact (an opening portion) in the first passivation film 119, the first insulating film 118, the insulating film 117, and the gate insulating film 114 with wet etching or dry etching.

It is noted that the contact shown in FIG. 2A and provided in the interlayer insulating film has a tapered shape in which a diameter becomes smaller toward the bottom and an angle made by a top surface of the interlayer insulating film and a slope of the contact (a corner portion of the contact) is on the order of 95 to 135 degree. In the contact, a drain electrode or a source electrode (Hereinafter, an electrode collectively) 120 is formed to be connected a source region or a drain region. At this time, patterning of the same layer is performed to form the signal line 101 and the current supply line 102 at the same time. In the present embodiment mode, the electrode, the signal line, and the current supply line are formed of a laminate film of Ti/Al/TiN, and the conductive film including TiN functions as a conductive barrier film.

Then, DC sputtering with a mask is employed to form the Cu wiring 108 on the signal line 101 and the current supply line 102. Note that it is possible to refer to Embodiment Mode 4 on detailed forming processes.

As mentioned above, the Cu wiring is formed on the signal line and the current supply line to obtain the wring including Cu as the signal line and the current supply line.

Figure 2B:
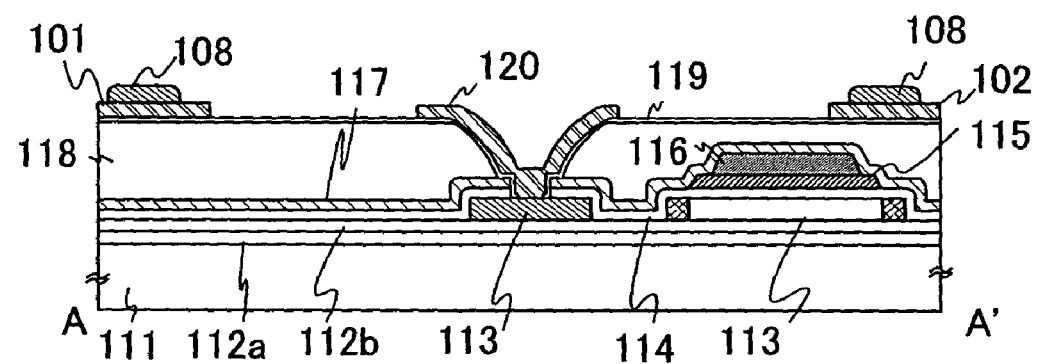

FIG. 2B shows a different structure from that of FIG. 2A in which the corner portion of the contact has the tapered shape with the angle. In FIG. 2B, a contact has a corner portion rounded and a diameter that becomes smaller toward the bottom. As a material of an interlayer insulating film in this case, a photosensitive or non-photosensitive organic material (polyimide, acrylic, polyamide, polyimideamide, resist, or benzocyclobutene) may be used. Then, wet etching or dry etching may be performed after exposure to form the structure with the contact. In the case of using the photosensitive organic material, however, exposure is carrier out to form the contact without etching. After providing the contact in the interlayer insulating film, the first passivation film 119 is formed.

Figure 2C:
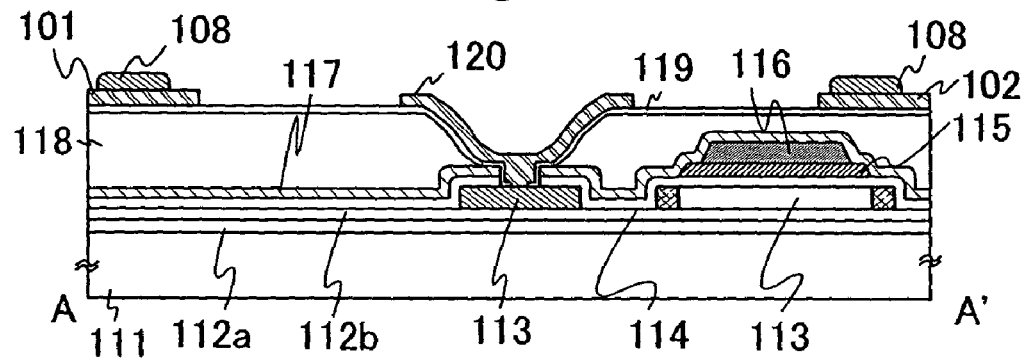

Further, FIG. 2C has a contact with another different tapered shape, and the contact has a corner portion rounded and a slope with two or more different curvature radiuses. As a material of an interlayer insulating film in this case, a photosensitive or non-photosensitive organic material (polyimide, acrylic, polyamide, polyimideamide, resist, or benzocyclobutene) may be used. Then, wet etching or dry etching may be performed after exposure to form the structure with the contact. In the case of using the photosensitive organic material, however, exposure is carried out to form the contact without etching. After providing the contact in the interlayer insulating film, the first passivation film 119 is formed.

The shape of the contact in the interlayer insulating film, shown in each of FIGS. 2A to 2C, makes it possible to prevent breaking of the wiring 102 of the capacitor 106 and the wiring 120 provided for the TFT 105.

Figure 3A:
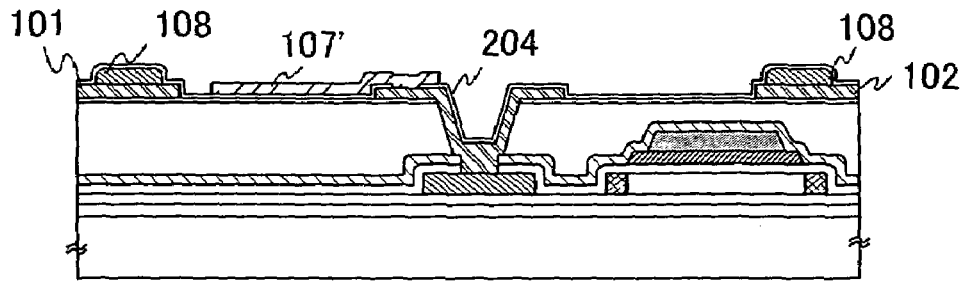
FIGS. 3A to 3D are diagrams that show sectional views of the pixel of the display device according to the present invention.

Then, an insulating barrier film 204 for covering the Cu wiring 108 is preferably formed as shown in FIG. 3A. In order to form the insulating barrier film 204, a material such as silicon nitride (SiN) or silicon oxynitride (SiNO) may be used. In the present embodiment mode, a film containing silicon nitride is formed with high frequency sputtering. Note that it is possible to refer to Embodiment Mode 4 on detailed forming processes. Since the Cu wiring is covered with the insulating barrier film 204, the risk of diffusion of Cu into the semiconductor film is further reduced.

Then, a photomask is used to form an opening portion in the insulating barrier film 204, and the pixel electrode 107' is formed to cover the opening portion. The pixel electrode 107' is connected to the wiring 120 through the opening portion.

Figure 3B:
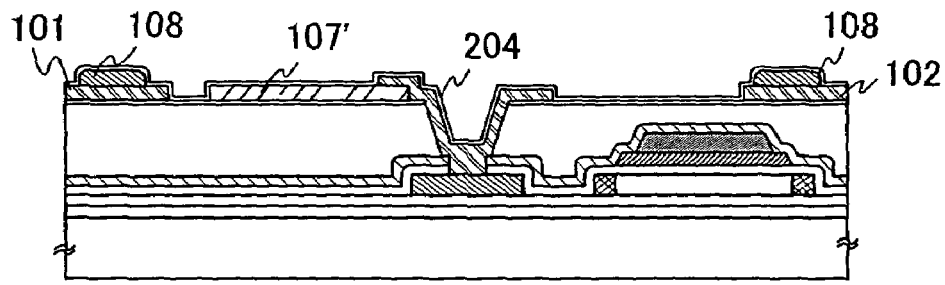
Figure 3C:
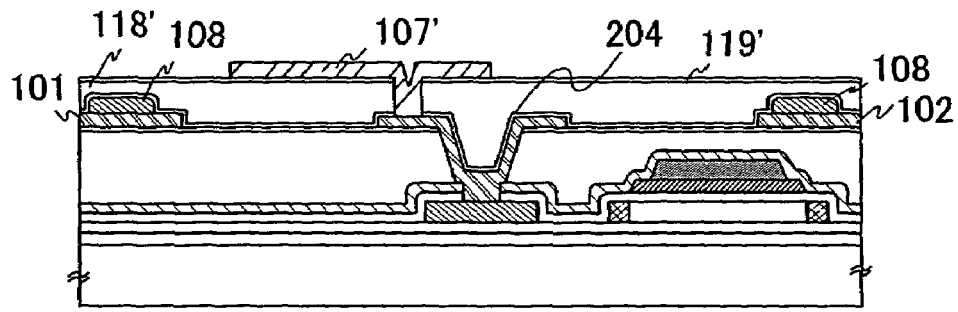

It is noted that structures shown in FIG. 3B and FIG. 3C are different from that of FIG. 3A in a forming order of the wiring 120, the insulating barrier film 204 and the pixel electrode 107' or a forming process of the opening portion in the insulating barrier film 204.

The structure shown in FIG. 3B is different from that of FIG. 3A in the forming order. In the case of forming the structure of FIG. 3B, the wiring 120, the signal line 101, and the current supply line 102 are formed after providing the pixel electrode 107', the Cu wiring 108 is formed on the signal line 101 and the current supply line 102, the insulating barrier film 204 is formed next, and then the opening portion is provided in the insulating barrier film 204 lastly.

In the case of forming the structure of FIG. 3C, along with the case of forming the structure of FIG. 3A, the wiring 120, the signal line 101, and the current supply line 102 are formed, the Cu wiring 108 is formed on the signal line 101 and on the current supply line 102, and the insulating barrier film 204 is formed. After that, differently from the case of FIG. 3A, an insulating film 118' as a second interlayer insulating film is formed and a second passivation film 119' is formed on the insulating film 118'. Then, an opening portion is provided in the insulating film 118' and the second passivation film 119', the pixel electrode 107' is provided in the opening portion to be connected to the wiring 120. It is noted that the insulating film 118' may be formed of the same material with the same means as the first insulating film 118 and the second passivation film 119' may be formed of the same material with the same means as the first passivation film 119.

Figure 3D:
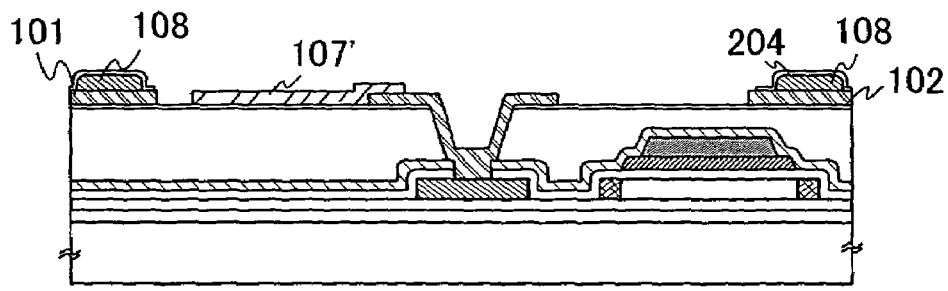

Further, a structure shown in FIG. 3D is different from those of FIGS. 3A to 3C since a manufacturing method of the insulating barrier film 204 in FIG. 3A is different from that of the insulating barrier film 204 in FIGS. 3A to 3C. In the case of forming the structure shown in FIG. 3D, the insulating barrier film 204 is formed with a mask to cover at least the Cu wiring 108 after forming the Cu wiring 108. Accordingly, it is unnecessary to provide the opening portion in the insulating barrier film 204 with the photomask.

In the case of the structure of FIG. 3D, a conductive barrier film may be used instead of the insulating barrier film 204. This is because insulation between the pixel electrode and the conductive barrier film is ensured with a second insulating film later formed. Since the conductive barrier film has smaller capacitance compared to the insulating barrier film, the Cu wiring covered with the conductive barrier film entirely is suitable for a high-speed operation.

It is noted that it is possible to apply the above-mentioned structure of the insulating barrier film 204 shown in FIG. 3D and the manufacturing method thereof to the cases of FIGS. 3A to 3C, and it becomes possible to use a conductive barrier film instead of the insulating barrier film 204.

Next, an explanation will be given with reference to FIGS. 4A to 4C on processes of providing a second insulating film that functions as a bank (also called a partition, or a barrier), forming an opening portion in the second insulating film on the pixel electrode, and providing a light emitting layer and the second electrode in the pixel electrode.

In FIG. 4A, a second insulating film 205 is formed at both ends of the pixel electrode 107' of the structure shown in FIG. 3A. A photosensitive or non-photosensitive organic material (polyimide, acrylic, polyamide, polyimideamide, resist, or benzocyclobutene), an inorganic material (such as silicon oxide, silicon nitride, or silicon oxynitride) formed with sputtering, CVD, or coating, or a laminate thereof is used to form the second insulating film 205. In the case of a photosensitive organic material for the second insulating film 205, one of two kinds of photosensitive organic materials classified roughly, a negative photosensitive organic material that becomes insoluble in an etchant with light or a positive photosensitive organic material that becomes soluble in an etchant with light, is appropriately used, an opening portion is formed on the pixel electrode 107', and the second insulating film 205 is formed at both ends of the pixel electrode 107'.

After that, a light emitting layer 206 including an organic compound is formed in the opening portion, and a second electrode 207 is formed on the light emitting layer 206. It is preferable to perform heating under vacuum for degassing before or after forming the light emitting layer 206 including the organic compound. Also, it is preferable that a surface of the first electrode is planarized since the light emitting layer 206 including the organic compound is extremely thin, and for example, planarization may be performed with treatment of chemical mechanical polishing (typically, CMP) before or after patterning of the first electrode. In addition, cleaning (brush cleaning or bellclean cleaning) for cleaning foreign particles (such as dusts) may be performed in order to improve cleanness of the surface of the pixel electrode.

It is noted that the opening portion (contact) of the second insulating film 205, shown in FIG. 4A, has a tapered shape in which a diameter become smaller toward the bottom and an angle made by a top surface of the second insulating film 205 and a slope of the contact (a corner portion of the contact) is on the order of 95 to 135 degree.

A structure shown in FIG. 4B is different from that in FIG. 4A in which the corner portion of the contact has the tapered shape with the degree. In FIG. 4B, a contact has a corner portion rounded and a diameter that becomes smaller toward the bottom. As a material of the second insulating film 205, a photosensitive or non-photosensitive organic material (polyimide, acrylic, polyamide, polyimideamide, resist, or benzocyclobutene) may be used. Then, wet etching or dry etching may be employed after exposure to form the contact.

In the case of using the photosensitive organic material, however, exposure is performed to form the contact without etching.

Further, another different tapered shape of a contact is shown in FIG. 4C. The contact has a corner portion rounded and a slope with at least two different curvature radiuses R1 and R2. As a material of the second insulating film 205, a photosensitive or non-photosensitive organic material (polyimide, acrylic, polyamide, polyimideamide, resist, or benzocyclobutene) may be used. Then, wet etching or dry etching may be employed after exposure to form the contact. In the case of using the photosensitive organic material, however, exposure is performed to form the contact without etching.

Although FIGS. 4A to 4C is described based on the structure shown in FIG. 3A, it is possible to combine any of the structures shown in FIGS. 3B to 3D, and further FIGS. 2B and 2C.

Although the case of the display device that has the light emitting element is described in the present embodiment mode, it is needless to say that the wiring including Cu may be used as a signal line, an electrode, and other wiring in a display device that has a liquid crystal element.

As mentioned above, in the present embodiment mode, the wiring including Cu is used as the wiring represented by the signal line or current supply line, specifically, the wiring structure in which the Cu wiring is provided on the wiring is used. Accordingly, the Cu wiring is allocable to structures and manufacturing processes of all TFTs, pixel electrodes, and wirings.

Further, when the wiring including Cu is used in the present embodiment mode, it becomes possible to reduce voltage drop and around of a signal waveform. Additionally, it is possible to reduce an area of the wiring and the electrode and to achieve a narrowed frame in the display device that has the wiring including Cu with low resistance.

Embodiment Mode 2

In the present embodiment mode, an example in which a wiring including Cu is applied to a gate electrode will be described with reference to FIG. 5A to 5C.

Figure 5A:
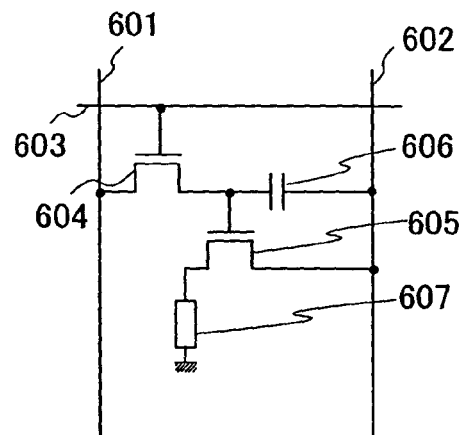
FIGS. 5A to 5C are diagrams that show a display device according to the present invention and a sectional view thereof.

FIG. 5A shows an equivalent circuit of a pixel in an EL display device. As shown in FIG. 5A, the pixel has at least a signal line 601, a current supply line 602, a scan line 603, plural TFTs 604 and 605, a capacitor 606, and a light emitting element 607. It is noted that the TFTs 604 and 605 may have a multi-gate structure such as a double-gate structure or a triple-gate structure instead of a single-gate structure.

Figure 5B:
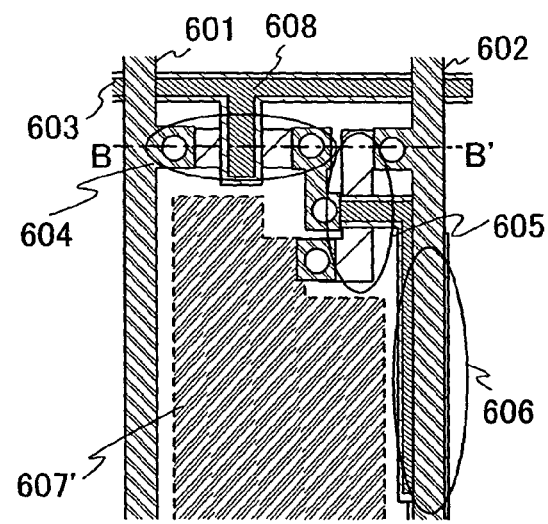

Further, FIG. 5B shows a top view of FIG. 5A in which a pixel electrode (a first electrode of the light emitting element) 607' is formed, and has the signal line 601, the current supply line 602, the scan line 603, TFTs 604 and 605, the capacitor 606, and the pixel electrode 607' of the light emitting element. A Cu wiring 608 is provided on the can line 603 and a gate electrode of the TFT 604, that is on the wiring formed of the same layer as the gate electrode.

Figure 5C:
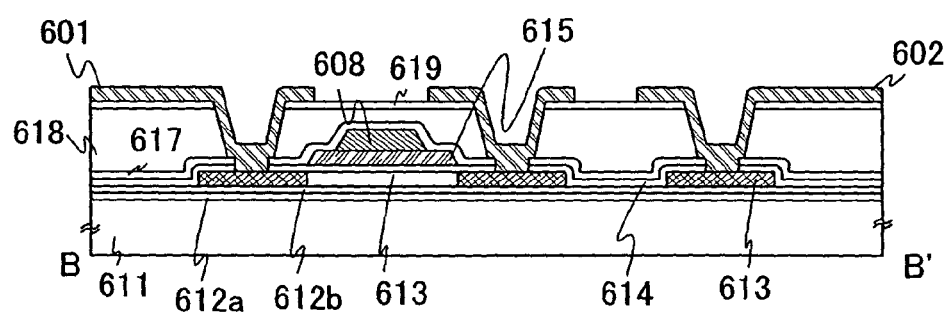

FIG. 5C shows a sectional view along B–B' in FIG. 5B. Similarly to FIG. 2C, a substrate with an insulating surface 611, a silicon oxynitride film 612a and a silicon oxynitride film 612b as a base film, a semiconductor film 613 of the TFTs 604 and 605 are provided. Then, a gate insulating film 614 is provided to cover the semiconductor film 613, and a conductive barrier film 615 and the Cu wiring 608 are formed over the semiconductor film 613. Namely, the present embodiment mode is characterized in that the wiring including Cu is used as the gate electrode. It is be possible to refer to Embodiment Mode 4 on forming processes of the wiring including Cu. The conductive barrier film 615 is formed using one selected from tantalum nitride (TaN), titanium nitride (TiN), and tungsten nitride (WN) or a laminate film of plurality thereof, and has a function as a protective film for preventing penetration of Cu due to diffusion into the semiconductor film 613. The same layer as the gate electrode is subjected to patterning to form the scan line 603 at the same time in addition to the gate electrode. That is, the scan line 603 has a laminate structure of the conductive barrier film and the Cu wiring.

Then, a source region, a drain region, and a channel forming region are formed in the semiconductor film 613 with gate electrode or resist as a mask. Additionally, an LDD region and a GOLD region overlapped with the gate electrode may appropriately be formed. It is noted that the source region, the drain region, the LDD region, or the GOLD region, into which an impurity is doped, is denoted as an impurity region. As an insulating film 617 covering the gate electrode, a silicon nitride film or a silicon oxynitride film is provided. The insulating film 617 functions as an insulating barrier film.

In order to activate the impurity regions, heating furnace or laser is used. At this time, it is preferable to irradiate laser (for example, excimer laser) from a back surface (a backside of the side with the semiconductor film formed) of the substrate for the activation in order to prevent Cu from diffusing to penetrate into the semiconductor film due to heating in the activation. More preferably, the impurity regions are formed after forming the conductive barrier film 615, the heating furnace or laser is used to activate the impurity regions, and then the Cu wiring 608 is formed.

In addition, for planarization, a photosensitive or non-photosensitive organic material (polyimide, acrylic, polyamide, polyimideamide, resist, or benzocyclobutene), an inorganic material (such as silicon oxide, silicon nitride, or silicon oxynitride) formed with sputtering, CVD, or coating, or a laminate thereof is used to form an interlayer insulating film 618 on the insulating film 617.

On the interlayer insulating film 618, a first passivation film 619 including a nitrided insulating film (typically, a silicon nitride film or a silicon oxynitride film) is formed. In the present embodiment mode, a silicon nitride film is use for the barrier insulating film 619. Then, wet etching or dry etching is used to form a contact (an opening portion) in the first passivation film 619, the interlayer insulating film 618, the insulating film 617, and the gate insulating film 614. As a shape of the contact, that is, a shape of the interlayer insulating film, any structure of FIGS. 2A to 2C may be applied.

In the contact, a drain wiring or a source wiring is formed and connected to the source region or the drain region, and patterning of the same layer as the wiring forms the signal line 601 and the current supply line 602 at the same time. After that, a light emitting layer and the like are formed as shown in FIGS. 3A to 3D and FIGS. 4A to 4C. It is noted that any structure of FIGS. 3A to 3D may be employed for a pixel electrode to be formed and any of FIGS. 4A to 4C may be used as a structure of an insulating film and the like for forming the light emitting layer.

In this way, it is possible to apply the wiring including Cu to the gate electrode. It is also possible to use the wiring including Cu as the signal line and the current supply line in addition to the gate electrode.

When the wiring including copper is applied to the gate electrode and the scan line as set fourth above, it is possible to reduce voltage drop and a deadened waveform and further to achieve a narrowed frame of the display device.

Embodiment Mode 3

In the present embodiment mode, an explanation will be given with FIGS. 6A to 6C on a whole configuration of an EL (electroluminescence) display device to which the Cu wiring is applicable. FIG. 6A shows a top view of the EL display device in which an element substrate that has a TFT formed is sealed with a sealing material, FIG. 6B shows a sectional view along B–B' of FIG. 6A, and FIG. 6C shows a sectional view along A–A' of FIG. 6A.

On a substrate 301, a pixel portion (display portion) 302 is arranged and a signal line driving circuit (source line driving circuit) 303, a scan line driving circuit (gate line driving circuit) 304a and 304b, and a protective circuit 305 are also arranged to surround the pixel portion 302. A sealant 306 is provided to surround the driving circuits. In addition, a Cu wiring 300 is provided over taken-around wirings from a signal line, a current supply line, and the signal line driving circuit to an input terminal pf FPC (flexible printed circuit). It is possible to refer to Embodiment Modes 1 and 2 on a structure of the pixel portion 302, particularly, on a structure of a wiring thereof. As a sealing material 307, glass, metal (typically, stainless), ceramics, or plastic (including a plastic film) can be used, and it is also possible to perform sealing only with an insulating film.

Additionally, it is necessary to use a translucent material for the sealing material 307 in accordance with an emission direction of light from a light emitting element. For example, light is emitted to a substrate side in the case of using a transparent electrode (ITO, for example) as the pixel electrode 107' shown in FIGS. 4A to 4C while light is emitted to the opposite side to the substrate side in the case of using a transparent electrode (ITO, for example) as the second electrode 207.

The sealant 306 may be provided to overlap with a portion of the signal line driving circuit 303, the scan line driving circuit 304a and 304b, and the protective circuit 305. The sealant 306 is used to provide the sealing material 307, and the substrate 301, the sealant 306, and the sealing material 307 are formed to form an enclosed space 308. The sealing material 307 has a desiccant 309 (such as barium oxide or calcium oxide) provided in a concave portion thereof, which has a function of adsorbing moisture and oxygen to keep clean inside the enclosed space 308 and suppress degradation of a light emitting layer. The convex portion is covered with a meshed cover material 310, and air and moisture can pass through the cover material 310 while no desiccant 309 can go through the cover material 310. It is noted that the enclosed space 308 may be filled with rare gas such as argon, and filling with inactive resin or liquid is also possible.

In the present embodiment mode, the protective circuit 305 is provided between an input terminal portion 311 and the signal line driving circuit 303 to let static electricity such as a sudden pulse signal therebetween go outside. On this occasion, the instantaneous signal with high voltage is deadened first, and the circuit including a semiconductor film can let the deadened high voltage go outside. The protective circuit, of course, may be provided at the other position, for example, between the pixel portion 302 and the signal line driving circuit 303 or between the pixel portion 302 and the scan line driving circuit 304a or 304b.

Further, the input terminal portion 311 for transmitting a signal to the signal line driving circuit 303 and the scan line driving circuit 304a and 304b is provided on the substrate 301, and a data signal such as a video signal is transmitted to the input terminal portion 311 through FPC 312. The FPC is also connected to a taken-around wiring from a second electrode of a light emitting element and a taken-around wiring form a scan line which are not shown in the figures.

FIG. 6B shows a section of the input terminal portion 311, and an input wiring is electrically connected to a wiring 315 provided at the FPC 312 side with resin 317 with a conductor 316 dispersed therein. The input wiring has a structure in which conductive oxide film 314 is laminated in a wiring 313 formed at the same time as the scan line (gate wiring) or the signal line (source wiring). For the conductor 316, a spherical polymer may be subjected to gold coating or silver coating.

Figure 7A:
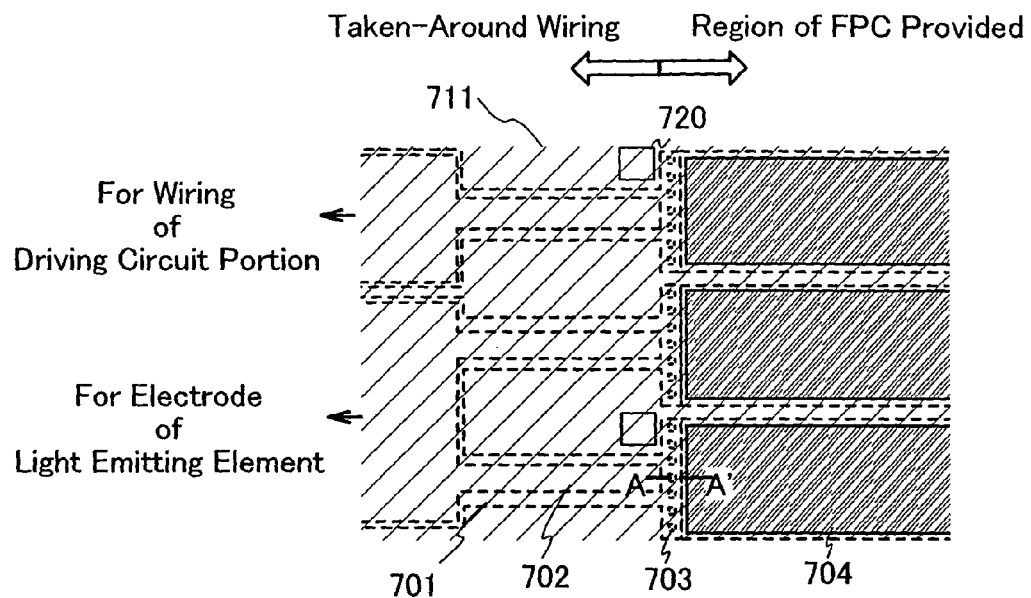
FIGS. 7A to 7C are diagrams that show a display device according to the present invention.

FIGS. 7A shows an enlarged view of the input terminal portion 311 (in particular, a portion 320 shown in FIG. 6A), specifically, shows a top view of a first wiring 701 (to be a taken-around wiring for a connection with FPC) formed at the same time as the signal line and the current supply line, a Cu wiring 702 provided on the first wiring 701, a contact 703 provided in a first insulating film 707, and a transparent electrode (an ITO film, for example) 704. It is noted that the first wiring 701 includes a conductive barrier film.

Figure 7B:
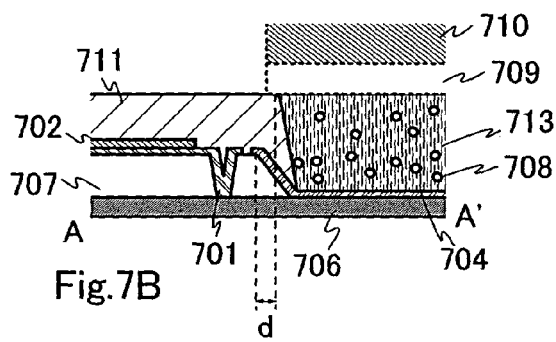
Figure 7C:
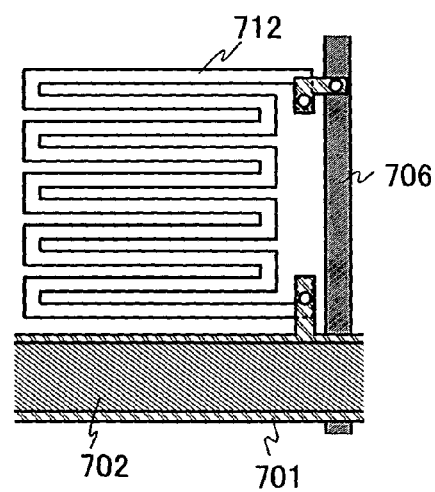

FIG. 7B shows a sectional view along A–A' in FIG. 7A. First, on a second wiring 706 formed at the same time as the gate wiring, the first insulating film 707 formed at the same time as an interlayer insulating film is provided. After that, the first wiring 701 as the taken-around wiring is formed in the contact (opening portion) 703 formed in a first insulating film 707, and is connected to the second wiring 706 through the contact. On the first wiring 701, the Cu wiring 702 subjected to patterning is formed to extend in front of the contact 703. The transparent electrode 704 is formed to extend from a position on the first insulating film 707, and may be formed to have contact with the first wring 701. Next, a second insulating film 711 is formed over the first insulating film to cover the first wiring 701 and the Cu wiring 702, and an opening portion is formed in the second insulating film 711 to cover a periphery (called also an edge or a frame) of the transparent electrode 704 and make the surface thereof exposed (the top view of the FIG. 7A). It is noted that a margin "d" between the first and second insulating films 707 and 711 is set to several μm, for example, 3 μm.

Here, Fug. 7C shows an enlarged view of a protective circuit 720 and its vicinity. In the vicinity of a connecting region to the FPC (hereinafter, a connecting region), a semiconductor film 712 including silicon formed at the same time as an active layer of the TFT has a rectangle provided stepwise (zigzag). Then, the semiconductor film 712 is connected to the first and second wirings 701 and 706 through a contact to function as the protective circuit. With such protective circuit provided, the semiconductor layer functions as a resistor to be able to prevent excessive current due to static electricity and the like from flowing to the driving circuit portion and the pixel portion.

Besides, a TFT or a thin film diode may be provided instead of the semiconductor film. For example, a TFT or a thin film diode, provided to connect to a signal line (signal input line) to which a start pulse or a clock pulse input to the signal line driving circuit or the scan line driving circuit is input, may be used as a protective circuit. Of course, a plurality of semiconductor films, TFTs, or thin film diodes may be provided.

Further, the connection between a terminal of the FPC and the taken-around wiring is different in the case of connecting the taken-around wiring to the electrode of the light emitting element from the case of connecting the taken-around wiring to the wiring of the driving circuit portion. That is, in the case of connecting the taken-around wiring to the electrode of the light emitting element, a wider width of the taken-around wiring is designed and two FPC terminals are connected with respect to the taken-around wiring since it is desired to lower resistance as much as possible. On the other hand, in the case of connecting the taken-around wiring to the wiring of the driving circuit, a narrower width of the taken-around wiring is designed, compared to the above-mentioned case, and one FPC terminal is connected with respect to the taken-around wiring. In this way, the number of connected FPC terminals is set in consideration of the object connected to the taken-around wiring. Furthermore, the protective circuit may be provided with respect to each electrode of the light emitting elements and each wiring of the driving circuit portion.

Then, not shown in the top view of FIG. 7A, resin 713 including a conductor 708 is formed in the opening portion of the second insulating film 711, and connected to FPC 710 through a wiring 709 provided at the FPC side.

As set forth above, in the present embodiment mode, the Cu wiring 702 is provided at the predetermined position of the taken-around wiring to reduce wiring resistance, and it is possible to prevent heat from generating from the wiring. Especially, in the case of a middle-sized or a large-sized panel, it is necessary to make large current flow. Accordingly, it is useful to use the Cu wiring 702 with low electric resistance as the present embodiment mode since there is an advantage that large current can be made to flow.

Embodiment Mode 4

The Cu wiring is formed with DC sputtering, RF sputtering, or remote plasma. In the present embodiment mode, an explanation will be given with FIGS. 8 to 10 on how to form the Cu wiring.

Figure 10:
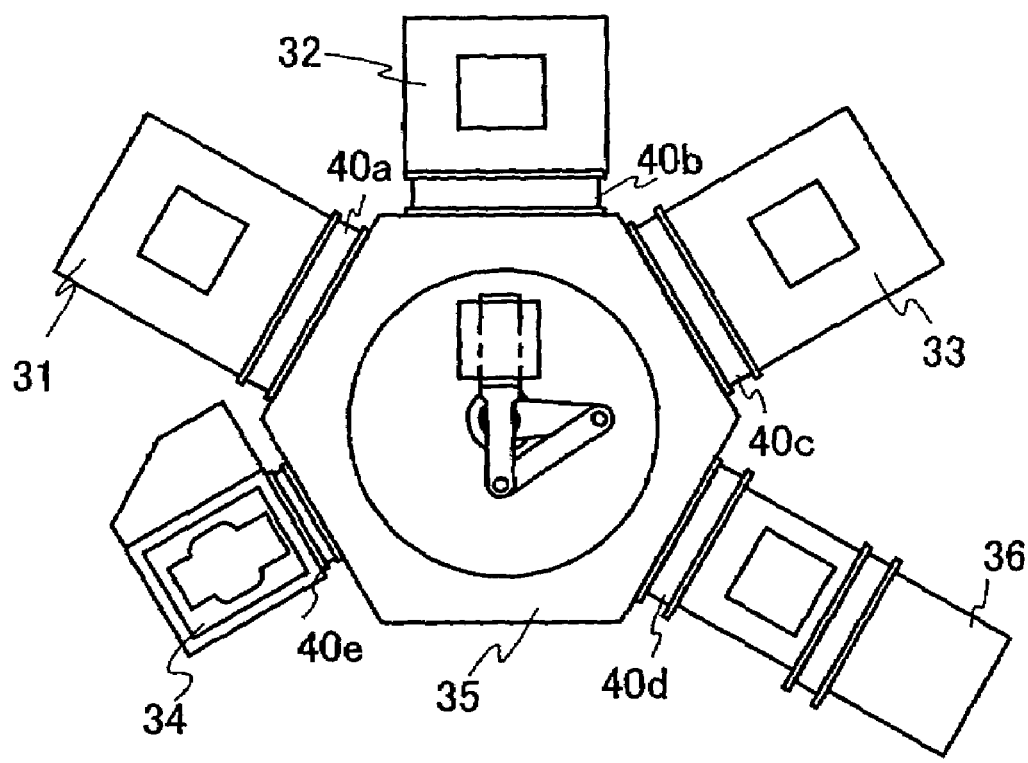
FIG. 10 is a diagram that shows a deposition system for forming a wiring according to the present invention.
Figure 11A:
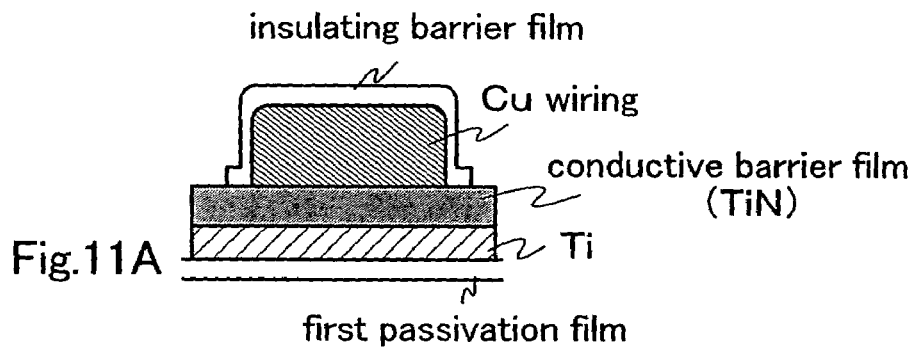
FIGS. 11A to 11D are diagrams that show wirings according to the present invention.
Figure 11B:
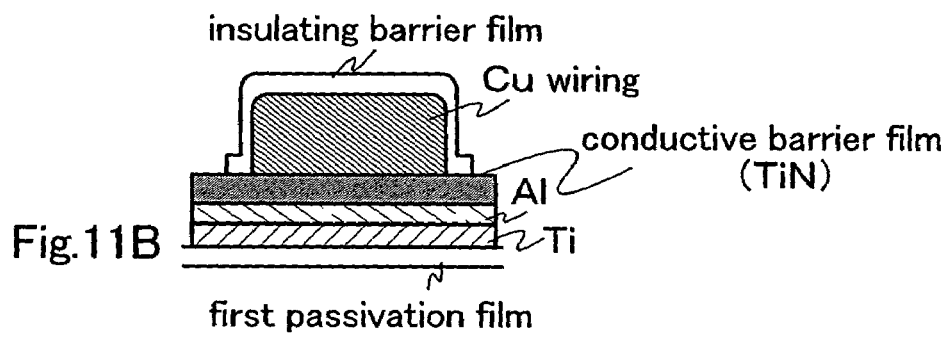
Figure 11C:
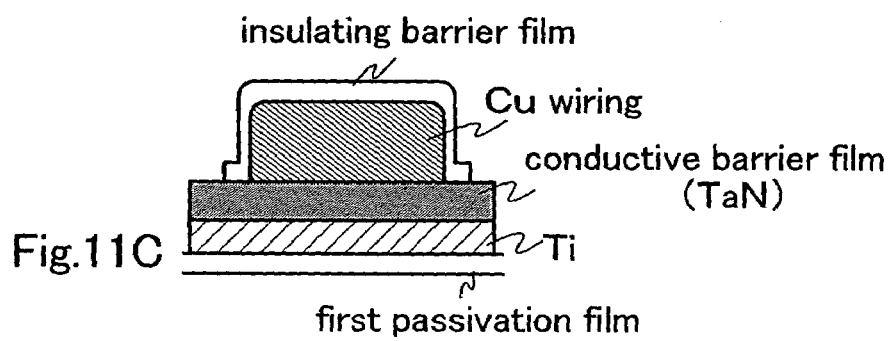
Figure 11D:
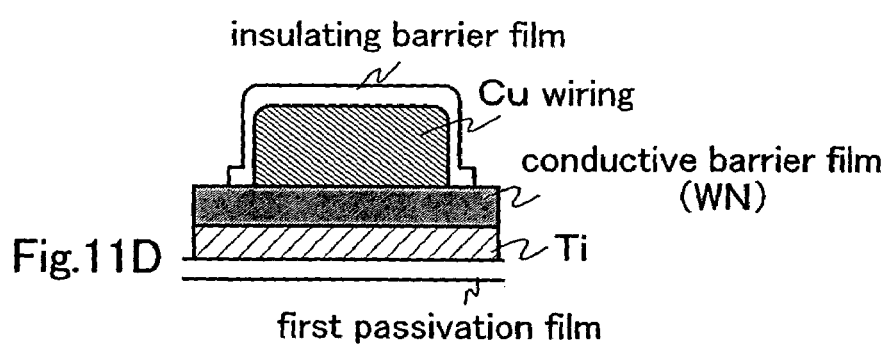

FIG. 10 shows a multi-chamber system including a transferring chamber 35 in the center, a first deposition chamber 31 for forming a conductive barrier film, a second deposition chamber 32 for forming a Cu wiring, a third deposition chamber 33 for forming an insulating barrier film, a takeout chamber 34 for taking a substrate out, and a loading chamber 36. The transferring chamber 35 is connected with the respective deposition chamber, the loading chamber, and the takeout chamber respectively through transferring gates 40a to 40d. It is noted that reduced pressure is kept in the multi-chamber system at deposition.

With the multi-chamber system as show in FIG. 10, it becomes possible to form the conductive barrier film, the Cu wiring, and the insulating barrier film continuously without exposing to the air. When such continuous deposition is performed, it becomes possible to prevent impurities from adhering to the interface and perform favorable deposition.

Figure 8:
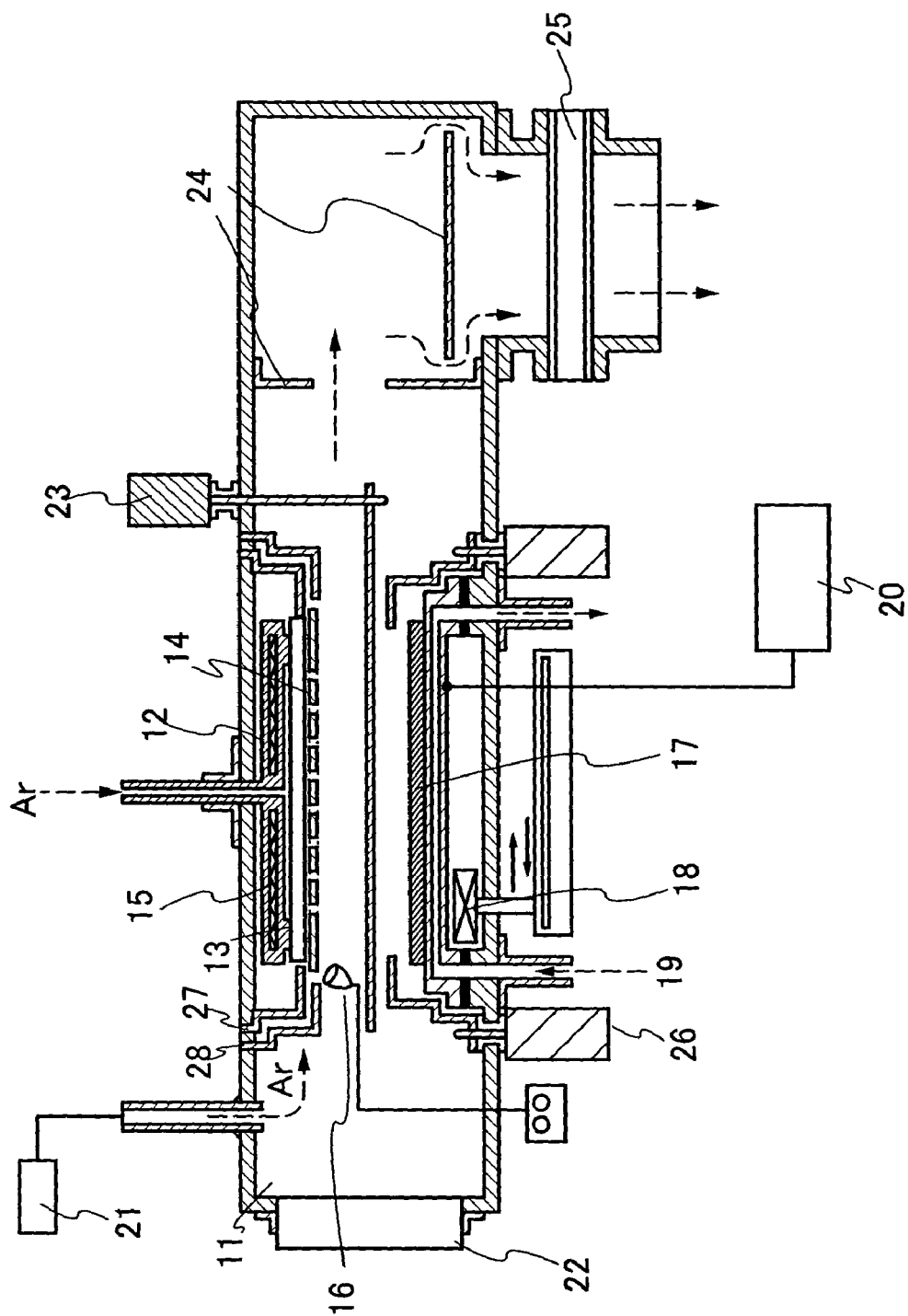
FIG. 8 is a diagram that shows a deposition system for forming a wiring according to the present invention.

FIG. 8 shows an example of a deposition system of the second deposition chamber shown in FIG. 10. The deposition system has a deposition chamber 11 provided with a transferring port (takeout port) 22 for taking an object to be processed (a substrate) out. In the deposition chamber 11, a target of Cu 17 is provided being cooled down with a cooling medium 19 (water-cooled) through a backing plate, and circular motion or linear motion of a permanent magnet 18 in parallel directions to the target (directions indicated by allows in the figure) makes it possible to form a film with a favorable uniformity in a film thickness on a surface of an opposing substrate. A shutter 23 opens and closes before and after starting deposition, and prevents a film from being formed in a state with unstable plasma at the beginning of discharge.

A substrate holder 27 and a mask holder 28 are moved to set a substrate 13 and a mask 14. At this time, the alignment of the substrate and the mask may be carried out with a CCD camera 16 provided in the deposition chamber. Further, a magnetic substance (magnet) 15 is provided in a substrate holding means 12, and keeps the substrate 13 and the mask 14 fixed. In order to prevent the substrate in contact with the mask, a spacer may be provided to keep a gap (a height). Besides, a means for holding the target 17 has a means 26 for moving the target up and down to be able to control a distance between the substrate 13 and the target 17 at deposition. Of course, a means for moving up and down may be provided for the substrate holding means 12 to control a distance between the substrate 13 and the target 17 at deposition.

In addition, a sheathed heater may be mounted as a heating means into the substrate holding means 12 and further heated rare gas (Ar gas) may be introduced from a backside of the substrate to perform heating uniformly. From a gas introducing means 21, gas such as rare gas and oxygen gas is introduced, and the pressure within the deposition chamber 11 is controlled with a conductance valve 25. A current plate 24 is provided for rectifying a current of sputtering gas. A high-frequency power source 20 is provided for the target, and high-frequency electric power is applied to perform sputtering.

When sputtering with the configuration of FIG. 8 is employed, the Cu wiring can be formed with the target of Cu. The deposition of the Cu wiring may be carried out under the condition of heating the substrate at room temperature. In order to further improve adhesiveness to a base, however, it is better to heat also the inside of the deposition chamber at temperatures from 100 to 300° C., preferably, from 150 to 200° C. A typical frequency of the applied high-frequency electric power is 13.56 MHz.

The first and third deposition chambers also have a similar configuration to the deposition system shown in FIG. 8. In the case of forming a silicon nitride film, For example, a silicon target is used and sputtering gas of nitrogen and rare gas is used. Although a typical frequency of applied high-frequency electric power is 13.56 MHz, a higher frequency of 27 to 120 MHz may be used. As the frequency is getting increased, a chemical reaction becomes to have a priority in a mechanism of deposition, and it is expected to form a dense film with less damage to the base. The rare gas used as the sputtering gas may also be used as gas for heating the substrate, and the rare gas may be introduced from the backside of the substrate as shown in FIG. 8.

In the case of forming a TiN film for the conductive barrier film, deposition may be carried out at output power of 150 W, using sputtering gas of nitrogen and argon. Thus formed TiN film has a polycrystalline structure, and the function of preventing diffusion is enhanced due to an existence of grain boundaries. It is noted that it is possible to form a dense film to improve the property as a barrier when sputtering is performed under conditions of larger output power, an increased flow rate of argon, and a higher temperature of the substrate.

Figure 9:
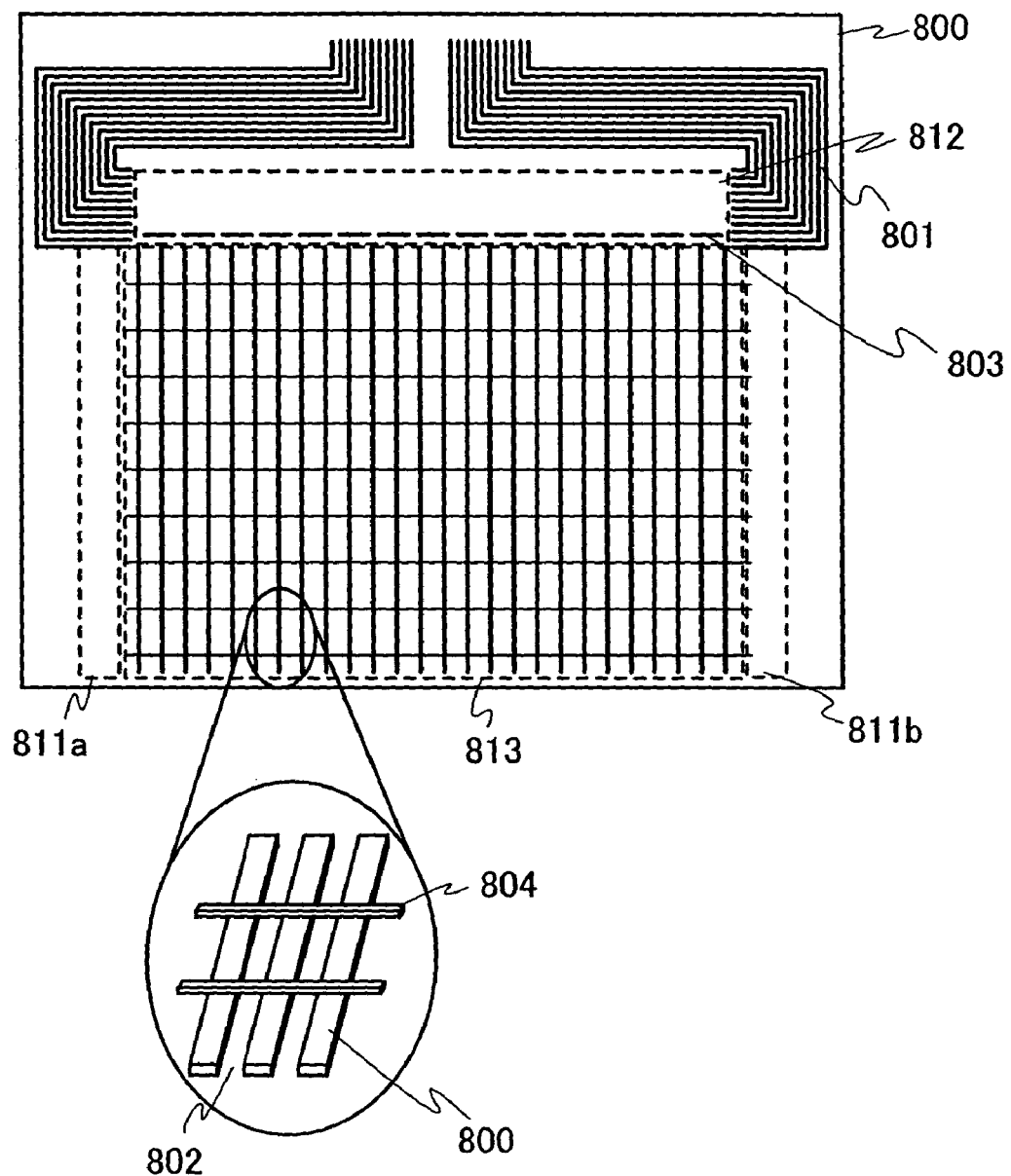
FIG. 9 is a diagram that shows a mask for forming a wiring according to the present invention.

FIG. 9 shows an example of the mask 14 used for the deposition of the Cu wiring, dotted lines indicate an arrangement of scan line driving circuits 811a and 811b, a signal line driving circuit 812, and a pixel portion 813. It is a mask 800 in the case of forming the Cu wiring over a taken-around wiring, a signal line, and source and drain electrodes of a buffer TFT provided in the signal line driving circuit 812 that FIG. 9 shows. Accordingly, the mask 800 has a slit 801 for the taken-around wiring, a slit 802 for the signal line, and a slit 803 for the source and drain electrodes formed. It is noted that the slits of the mask 800 has a width of 5 μm or more, and the width may appropriately be set for a Cu wiring with a narrow width of 5 to 20 μm provided for the signal line in the pixel portion and a Cu wiring with a broad width of 150 to 1000 μm provided for the taken-around wiring. Additionally, It is preferable that a section of the slit has a taper shape toward the substrate in order to improve accuracy of deposition.

It is noted that the mask 800 has, for reinforcing, an auxiliary wiring 804 provided in a direction perpendicular to the slit. In order not to become a barrier at deposition, the auxiliary wiring 804 may have a width and a length appropriately set and may be arranged appropriately. At deposition of the Cu wiring, the auxiliary wiring 804 is fixed not to face the substrate, that is, at the opposite surface of the mask to the surface facing the substrate. With such auxiliary wiring, it is possible to prevent a wiring to be formed from varying in width and meandering. The mask described above is formed of nickel, platinum, copper, stainless, or quartz glass. In particular, a mask formed of a metal material is called a metal mask. Besides, it is preferred that the mask is formed to have a thickness on the order of 5 to 25 μm although the thickness depends on a width of a wiring to be formed.

With the deposition method as set forth above, the Cu wiring can be formed. Then, it is possible to reduce wiring resistance and manufacture a display device with less heating.

Embodiment Mode 5

Electronic devices, each using a display device according to the present invention, include a video camera, a digital camera, a goggles-type display (head mount display), a navigation system, a sound reproduction device (such as an in-car audio system and an audio set), a lap-top computer, a game machine, a portable information terminal (such as a mobile computer, a cellular phone, a portable game machine, and an electronic book), an image reproduction device including a recording medium (more specifically, an device which can reproduce a recording medium such as a digital versatile disc (DVD) and display the reproduced image), and the like. In particular, it is preferable that the Cu wiring according to the present invention is used for an electronic device with a large-sized screen such as a large-sized television. FIGS. 12A to 12C show specific examples of such electronic devices.

FIG. 12A illustrates a large-sized display device which includes a casing 2001, a support table 2002, a display portion 2003, a speaker portion 2004, a video input terminal 2005 and the like. The wiring including Cu of the present invention can be used as a wiring and an electrode provided in the display portion 2003 to complete the large-sized display device shown in FIG. 12A according to the present invention. It becomes possible to enhance a reduction of voltage drop and a deadened signal in the large-sized display device with a long wiring length when the wiring including Cu is provided to achieve lower resistance. The display device includes all display devices for displaying information, such as a personal computer, a receiver of TV broadcasting and an advertising display.

FIG. 12B illustrates a lap-top computer which includes a main body 2201, a casing 2202, a display portion 2203, a keyboard 2204, an external connection port 2205, a pointing mouse 2206, and the like. The wiring including Cu of the present invention can be used as a wiring and an electrode provided in the display portion 2203 to complete the lap-top computer in FIG. 12B according to the present invention.

FIG. 12C illustrates a portable image reproduction device including a recording medium (specifically, a DVD reproduction device), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The wiring including Cu of the present invention can be used as a wiring and an electrode provided in the display portions A and B 2043 and 2404. The image reproduction device including the recording medium further includes a home game machine or the like.

It is noted that the wiring including Cu of the present invention can be used for a front-type or rear-type projector in which light including output image information is enlarged and projected with a lens or the like.

Further, it is necessary to supply an accurate signal to a light emitting portion of a light emitting device since the light emitting portion consumes electric power. Accordingly, the wiring including Cu of the present invention may be used for the mobile information terminal.

As set forth above, the present invention can be applied quite widely to electric apparatus in various fields. Besides, the electric devices in the present embodiment mode can use any of structures shown in Embodiment Mode 1 to 4.

As set fourth above, it is possible according to the present invention to use the wiring including Cu as any of wirings and electrodes such as a signal line, a scan line, a current supply line, a source electrode, a drain electrode, and a gate electrode. With Cu that has low resistance and makes it possible to flow large current, it is possible to reduce voltage drop and a deadened signal waveform. In particular, it is effective to use the wiring including Cu of the present invention for a middle-sized or a large-sized panel. In addition, a display device that has the wiring including Cu with low resistance can have an area of a wiring and an electrode reduced, and it is also possible to achieve a narrowed frame.

Further, in the present invention, sputtering with a mask is employed to be able to manufacture the Cu wiring with high precision. Accordingly, it is unnecessary to employ complicated processes such as damascene, and it is possible to provide a display device with a low cost and a high yield.

What is claimed is:

1. A semiconductor device comprising:
   a conductive barrier film; and
   a wiring containing Cu as its main component over the conductive barrier film,
   wherein a width of a top surface of the conductive barrier film is not aligned with that of the wiring containing Cu as its main component, and
   wherein the width of the conductive barrier film is 30 to 40 μm and the width of the wiring containing Cu as its main component is 5 to 20 μm.

2. A semiconductor device according to claim 1, wherein the conductive barrier film comprises at least one of TiN, TaN, TiC, TaC, and WN.

3. A semiconductor device according to claim 1, wherein the wiring containing Cu as its main component is covered with an insulating barrier film, and the insulating barrier film comprises at least one of silicon nitride, silicon oxynitride, and aluminum nitride.

4. A semiconductor device according to claim 1, wherein the semiconductor device is incorporated in an electronic device selected from the group consisting of a large-sized display device, a lap-top computer, a portable image reproduction device including a recording medium and a portable information terminal.

5. A semiconductor device comprising:
a conductive barrier film; and
a wiring containing Cu as its main component over the conductive barrier film,
wherein a width of a top surface of the conductive barrier film is not aligned with that of the wiring containing Cu as its main component,
wherein an insulating barrier film covers the top surface and a side surface of the wiring containing Cu as its main component, and
wherein the width of the conductive barrier film is 30 to 40 μm and the width of the wiring containing Cu as its main component is 5 to 20 μm.

6. A semiconductor device according to claim 5, wherein the conductive barrier film comprises at least one of TiN, TaN, TiC, TaC, and WN.

7. A semiconductor device according to claim 5, wherein the insulating barrier film comprises at least one of silicon nitride, silicon oxynitride, and aluminum nitride.

8. A semiconductor device according to claim 5, wherein the semiconductor device is incorporated in an electronic device selected from the group consisting of a large-sized display device, a lap-top computer, a portable image reproduction device including a recording medium and a portable information terminal.

9. A semiconductor device comprising:
a conductive film;
a conductive barrier film on the conductive film; and
a wiring containing Cu as its main component over the conductive barrier film,
wherein a width of the conductive film is aligned with that of the conductive barrier film, and
wherein a width of the wiring containing Cu as its main component is narrower than that of the conductive barrier film.

10. A semiconductor device according to claim 9, wherein the conductive barrier film comprises at least one of TiN, TaN, TiC, TaC, and WN.

11. A semiconductor device according to claim 9, wherein the conductive film comprises Ti.

12. A semiconductor device according to claim 9, wherein the wiring containing Cu as its main component is covered with an insulating barrier film, and the insulating barrier film comprises at least one of silicon nitride, silicon oxynitride, and aluminum nitride.

13. A semiconductor device according to claim 9, wherein the semiconductor device is incorporated in an electronic device selected from the group consisting of a large-sized display device, a lap-top computer, a portable image reproduction device including a recording medium and a portable information terminal.

14. A display device comprising:
at least a signal line and a scan line provided to intersect with the signal line,
wherein the signal line comprises a conductive film, a conductive barrier film on the conductive film, and a wiring containing Cu as its main component over the conductive barrier film, and
wherein a width of the conductive film is aligned with that of the conductive barrier film, and a width of the wiring containing Cu as its main component is narrower than that of the conductive barrier film.

15. A display device according to claim 14 further comprising a light emitting element, wherein driving current is supplied to the light emitting element through the signal line.

16. A display device according to claim 14, wherein the conductive barrier film comprises at least one of TiN, TaN, TiC, TaC, and WN.

17. A display device according to claim 14, wherein the conductive film comprises Ti.

18. A display device according to claim 14, wherein the wiring containing Cu as its main component is covered with an insulating barrier film, and the insulating barrier film comprises at least one of silicon nitride, silicon oxynitride, and aluminum nitride.

19. A display device according to claim 14, wherein the display device is incorporated in an electronic device selected from the group consisting of a large-sized display device, a lap-top computer, a portable image reproduction device including a recording medium and a portable information terminal.

20. A display device comprising:
at least a signal line and a scan line provided to intersect with the signal line,
wherein the scan line comprises a conductive barrier film and a wiring containing Cu as its main component over the conductive barrier film,
wherein a width of the wiring containing Cu as its main component is narrower than that of the conductive barrier film, and
wherein the width of the conductive barrier film is 30 to 40 μm and the width of the wiring containing Cu as its main component is 5 to 20 μm.

21. A display device according to claim 20 further comprising a light emitting element, wherein voltage is input to the light emitting element through the signal line.

22. A display device according to claim 20, wherein the conductive barrier film comprises at least one of TiN, TaN, TIC, TaC, and WN.

23. A display device according to claim 20, wherein the wiring containing Cu as its main component is covered with an insulating barrier film, and the insulating barrier film comprises at least one of silicon nitride, silicon oxynitride, and aluminum nitride.

24. A display device according to claim 20, wherein the display device is incorporated in an electronic device selected from the group consisting of a large-sized display device, a lap-top computer, a portable image reproduction device including a recording medium and a portable information terminal.

25. A display device comprising:
at least a signal line and a scan line provided to intersect with the signal line,
wherein the signal line comprises a conductive film, a first conductive barrier film on the conductive film, and a first wiring containing Cu as its main component over the first conductive barrier film,
wherein the scan line comprises a second conductive barrier film and a second wiring containing Cu as its main component over the second conductive barrier film,
wherein a width of the conductive film is aligned with that of the first conductive barrier film, and a width of the first wiring containing Cu as its main component is narrower than that of the first conductive barrier film, and wherein a width of the second wiring containing Cu as its main component is narrower than that of the second conductive barrier film.

26. A display device according to claim 25 further comprising a light emitting element, wherein voltage is input to the light emitting element through the signal line.

27. A display device according to claim 25 further comprising a light emitting element and a TFT electrically connected to the light emitting element, wherein a gate electrode of the TFT also comprises the second conductive barrier film and the second wiring containing Cu as its main component over the second conductive barrier film.

28. A display device according to claim 25 further comprising a light emitting element and a TFT electrically connected to the light emitting element, wherein source and drain electrodes of the TFT also comprises the conductive film, the first conductive barrier film, and the first wiring containing Cu as its main component over the first conductive barrier film.

29. A display device according to claim 25, wherein each of the first and second conductive barrier films comprises at least one of TiN, TaN, TiC, TaC, and WN.

30. A display device according to claim 25, wherein the conductive film comprises Ti.

31. A display device according to claim 25, wherein each of the first and second wiring is covered with an insulating barrier film, and the insulating barrier film comprises at least one of silicon nitride, silicon oxynitride, and aluminum nitride.

32. A display device according to claim 25, wherein the display device is incorporated in an electronic device selected from the group consisting of a large-sized display device, a lap-top computer, a portable image reproduction device including a recording medium and a portable information terminal.

33. A semiconductor device comprising:
a semiconductor film over an insulating surface; and
a gate electrode over the semiconductor film,
wherein the gate electrode comprises a conductive barrier film and a wiring containing Cu as its main component over the conductive barrier film,
wherein a width of the wiring containing Cu as its main component is narrower than that of the conductive barrier film, and
wherein the width of the conductive barrier film is 30 to 40 μm and the width of the wiring containing Cu as its main component is 5 to 20 μm.

34. A semiconductor device according to claim 33, wherein the conductive barrier film comprises at least one of TiN, TaN, TiC, TaC, and WN.

35. A semiconductor device according to claim 33, wherein the wiring containing Cu as its main component is covered with an insulating barrier film, and the insulating barrier film comprises at least one of silicon nitride, silicon oxynitride, and aluminum nitride.

36. A semiconductor device according to claim 33, wherein the semiconductor device is incorporated in an electronic device selected from the group consisting of a large-sized display device, a lap-top computer, a portable image reproduction device including a recording medium and a portable information terminal.

37. A semiconductor device comprising:
a semiconductor film over an insulating surface; and
a gate electrode over the semiconductor film,
wherein the gate electrode comprises a conductive film, a conductive barrier film on the conductive film, and a wiring containing Cu as its main component over the conductive barrier film,
wherein a width of the conductive barrier film is aligned with that of the conductive film, and
wherein a width of the wiring containing Cu as its main component is narrower than that of the conductive barrier film.

38. A semiconductor device according to claim 37, wherein the conductive barrier film comprises at least one of TiN, TaN, TiC, TaC, and WN.

39. A semiconductor device according to claim 37, wherein the conductive film comprises Ti.

40. A semiconductor device according to claim 37, wherein the wiring containing Cu as its main component is covered with an insulating barrier film, and the insulating barrier film comprises at least one of silicon nitride, silicon oxynitride, and aluminum nitride.

41. A semiconductor device according to claim 37, wherein the semiconductor device is incorporated in an electronic device selected from the group consisting of a large-sized display device, a lap-top computer, a portable image reproduction device including a recording medium and a portable information terminal.

42. A semiconductor device comprising:
at least a wiring comprising a conductive film, a conductive barrier film on the conductive film, and a wiring containing Cu as its main component over the conductive barrier film; and
an input terminal electrically connected to the wiring,
wherein a width of the conductive wiring is aligned with that of the conductive barrier film,
wherein a width of the wiring containing Cu as its main component is narrower than that of the conductive barrier film, and
wherein the input terminal is not overlapped with the wiring containing Cu as its main component.

43. A semiconductor device according to claim 42, wherein the input terminal is connected to the wiring through resin comprising a conductor.

44. A semiconductor device according to claim 42, wherein an edge of the input terminal is not aligned with that of the wiring containing Cu as its main component.

45. A semiconductor device according to claim 42, wherein the wiring is connected to a protective circuit including a semiconductor film.

46. A semiconductor device according to claim 45 further comprising a scan line, wherein the scan line is also connected to the protective circuit.

47. A semiconductor device according to claim 42, wherein the conductive barrier film comprises at least one of TiN, TaN, TiC, TaC, and WN.

48. A semiconductor device according to claim 42, wherein the conductive film comprises Ti.

49. A semiconductor device according to claim 42, wherein the wiring containing Cu as its main component is covered with an insulating barrier film, and the insulating barrier film comprises at least one of silicon nitride, silicon oxynitride, and aluminum nitride.

50. A semiconductor device according to claim 42, wherein the semiconductor device is incorporated in an electronic device selected from the group consisting of a large-sized display device, a lap-top computer, a portable image reproduction device including a recording medium and a portable information terminal.

51. A semiconductor device comprising:
a conductive barrier film; and
a wiring containing Cu as its main component over the conductive barrier film,
wherein an edge of the conductive barrier film is not aligned with that of the wiring containing Cu as its main component, and
wherein a width of the conductive barrier film is 30 to 40 μm and a width of the wiring containing Cu as its main component is 5 to 20 μm.

52. A semiconductor device according to claim 51, wherein the conductive barrier film comprises at least one of TiN, TaN, TiC, TaC, and WN.

53. A semiconductor device according to claim 51, wherein the wiring containing Cu as its main component is covered with an insulating barrier film, and the insulating barrier film comprises at least one of silicon nitride, silicon oxynitride, and aluminum nitride.

54. A semiconductor device according to claim 51, wherein the semiconductor device is incorporated in an electronic device selected from the group consisting of a large-sized display device, a lap-top computer, a portable image reproduction device including a recording medium and a portable information terminal.

55. A semiconductor device comprising:
a conductive film;
a conductive barrier film on the conductive film; and
a wiring containing Cu as its main component over the conductive barrier film,
wherein an edge of the conductive film is aligned with that of the conductive barrier film, and
wherein an edge of the wiring containing Cu as its main component is not aligned with that of the conductive barrier film.

56. A semiconductor device according to claim 55, wherein the conductive barrier film comprises at least one of TiN, TaN, TiC, TaC, and WN.

57. A semiconductor device according to claim 55, wherein the conductive film comprises Ti.

58. A semiconductor device according to claim 55, wherein the wiring containing Cu as its main component is covered with an insulating barrier film, and the insulating barrier film comprises at least one of silicon nitride, silicon oxynitride, and aluminum nitride.

59. A semiconductor device according to claim 55, wherein the semiconductor device is incorporated in an electronic device selected from the group consisting of a large-sized display device, a lap-top computer, a portable image reproduction device including a recording medium and a portable information terminal.

* * * * *